(12) United States Patent
Chia et al.

(10) Patent No.: US 6,991,147 B2
(45) Date of Patent: Jan. 31, 2006

(54) INSULATED BONDING WIRE TOOL FOR MICROELECTRONIC PACKAGING

(75) Inventors: Chok J. Chia, Cupertino, CA (US); Owai H. Low, Cupertino, CA (US); Ramaswamy Ranganathan, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 305 days.

(21) Appl. No.: 10/642,706

(22) Filed: Aug. 18, 2003

(65) Prior Publication Data

US 2004/0182911 A1 Sep. 23, 2004

Related U.S. Application Data

(62) Division of application No. 09/687,263, filed on Oct. 12, 2000, now Pat. No. 6,670,214.

(51) Int. Cl.
*B23K 31/02* (2006.01)
*B05D 5/12* (2006.01)

(52) U.S. Cl. ............... 228/4.5; 228/180.5; 427/117

(58) Field of Classification Search ............... 228/4.5, 228/180.5, 1.1, 110.1; 427/117
See application file for complete search history.

(56) References Cited

U.S. PATENT DOCUMENTS

| 4,002,282 A | * | 1/1977 | Murdoch ............... 228/4.5 |
| 5,285,949 A | * | 2/1994 | Okikawa et al. ........ 228/179.1 |
| 5,396,104 A | * | 3/1995 | Kimura ............... 257/784 |
| 5,795,818 A | * | 8/1998 | Marrs ............... 438/612 |
| 5,950,100 A | * | 9/1999 | Shingai ............... 438/617 |
| 6,046,075 A | * | 4/2000 | Manteghi ............... 438/123 |
| 6,281,450 B1 | | 8/2001 | Urasaki et al. |
| 6,670,214 B1 | * | 12/2003 | Chia et al. ............... 438/106 |
| 2004/0182911 A1 | * | 9/2004 | Chia et al. ............... 228/180.5 |

FOREIGN PATENT DOCUMENTS

| JP | 361269319 A | * | 11/1986 |
| JP | 401105553 A | * | 4/1989 |
| JP | 08288330 A | * | 11/1996 |

\* cited by examiner

*Primary Examiner*—Kiley S. Stoner
(74) *Attorney, Agent, or Firm*—Fitch, Even, Tabin & Flannery

(57) ABSTRACT

A method for insulating a bonding wire that includes the steps of attaching a bonding wire to a bond pad and coating the bonding wire with an insulating liquid while drawing the bonding wire through a bond tool from the bond pad to a package lead.

5 Claims, 4 Drawing Sheets

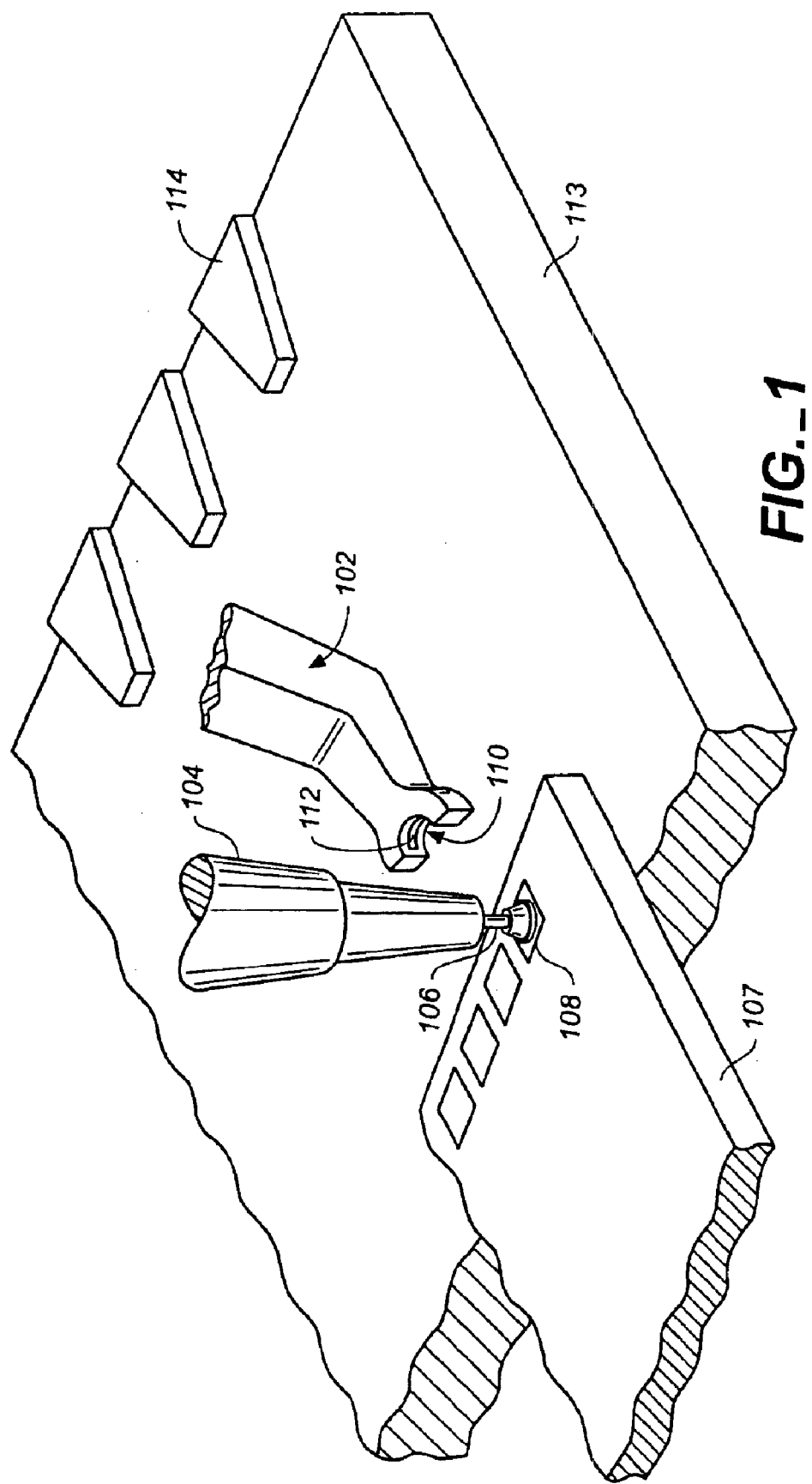
FIG._1

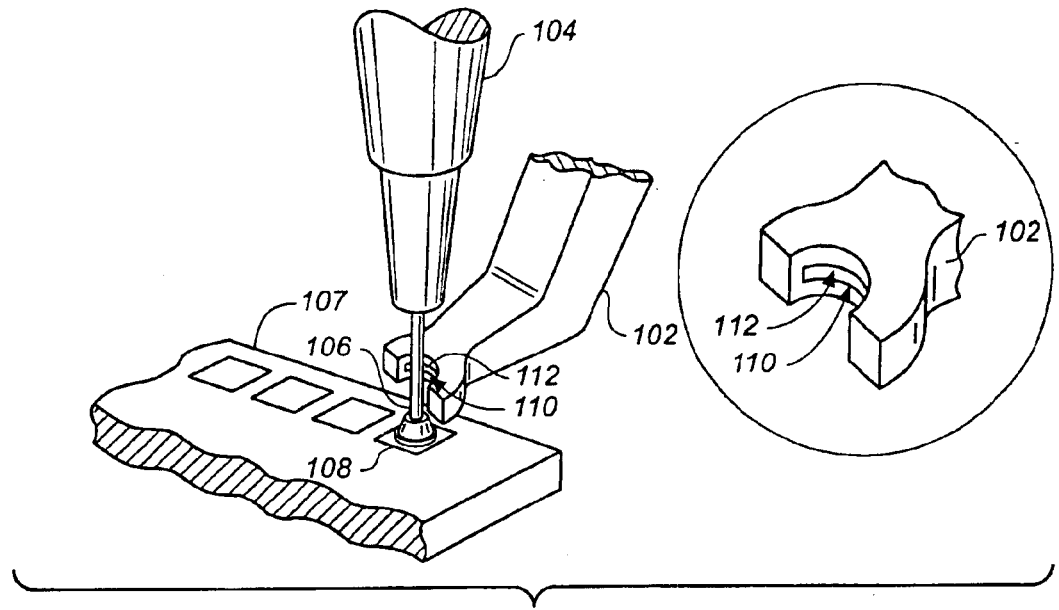
FIG._2
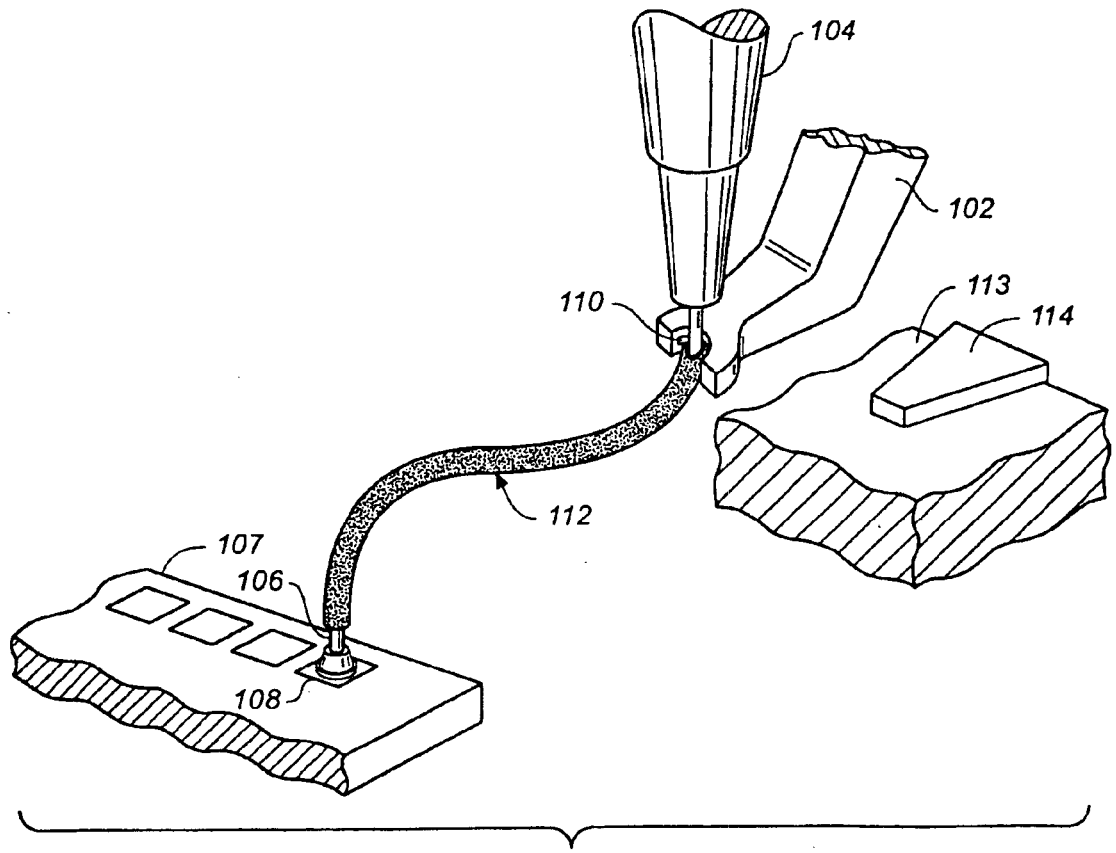
FIG._3

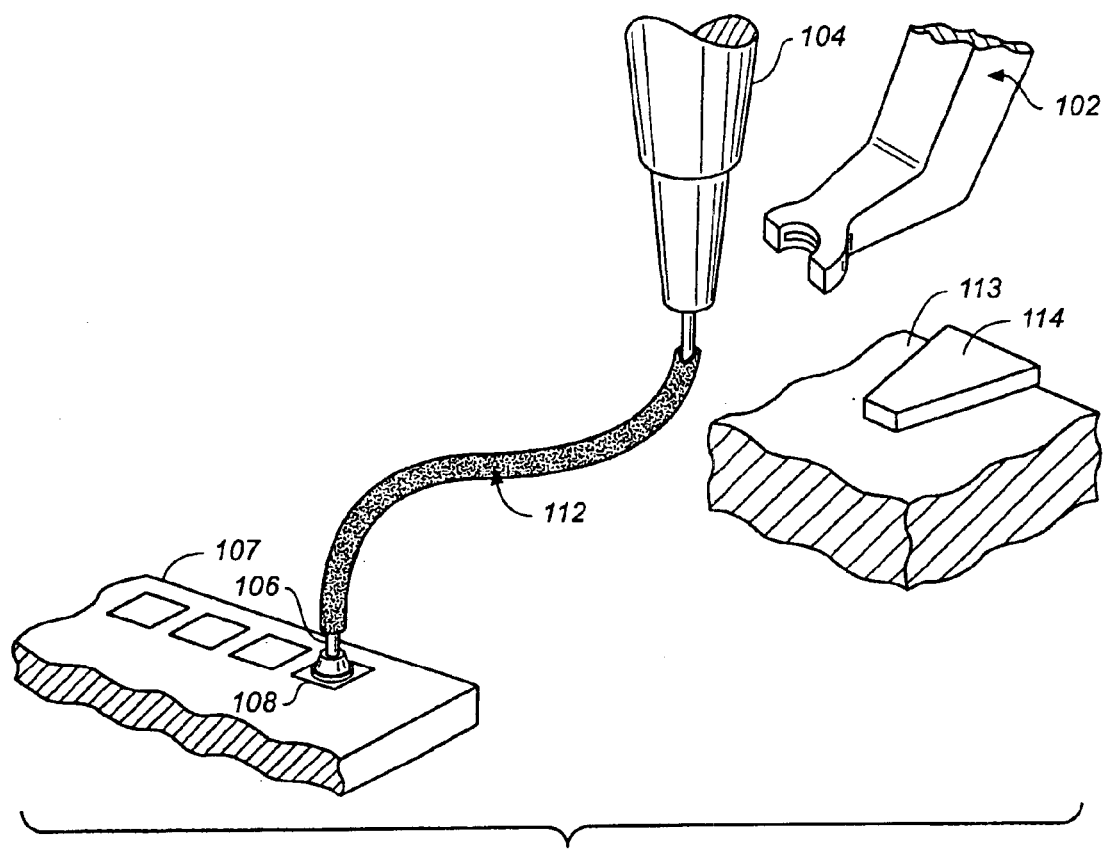
FIG._4

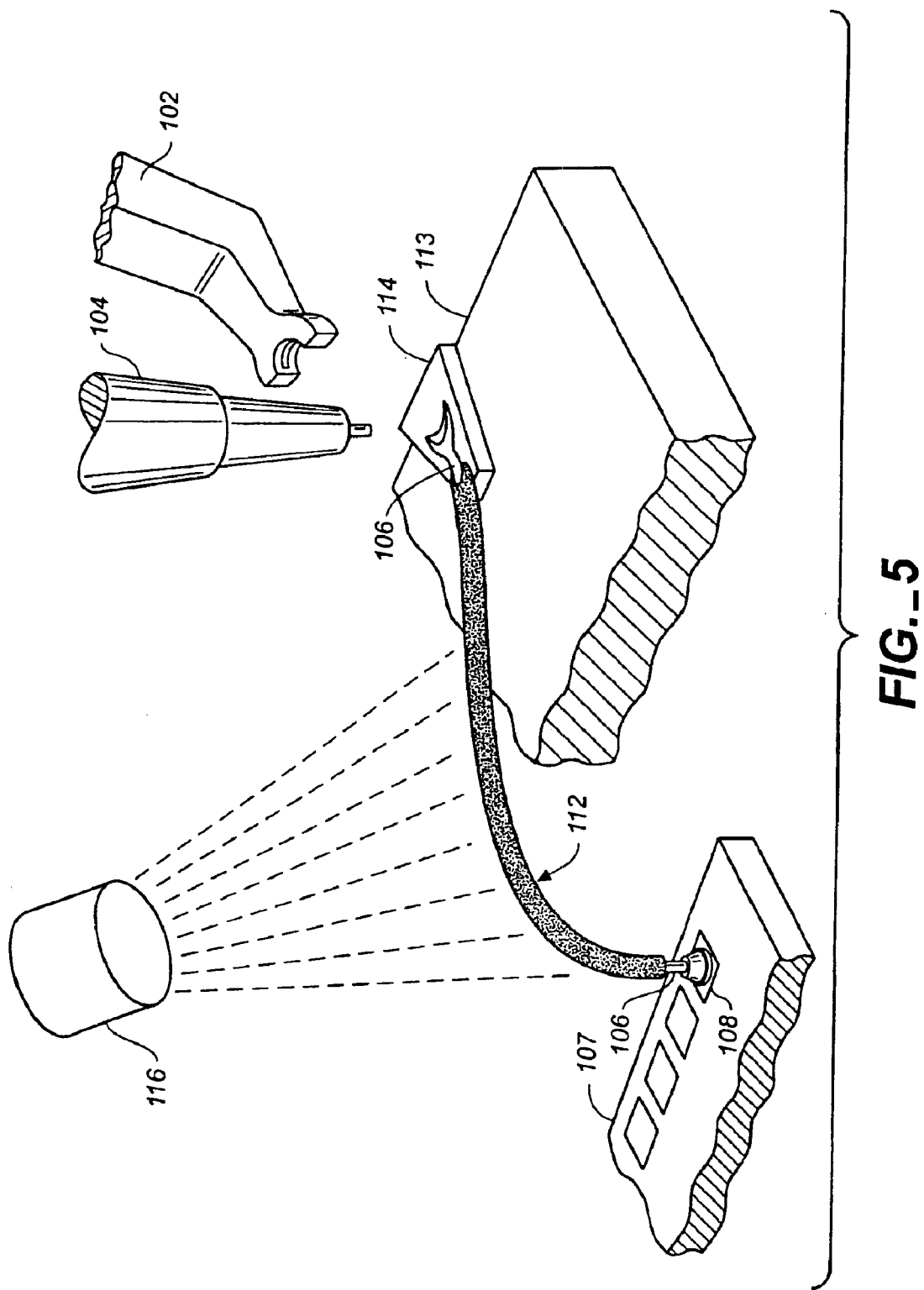
FIG._5

INSULATED BONDING WIRE TOOL FOR MICROELECTRONIC PACKAGING

CROSS REFERENCE TO RELATED APPLICATIONS

This is a Divisional Application of U.S. patent application Ser. No. 09/687,263 Now U.S. Pat. No. 6,670,214, for INSULATED BONDING WIRE FOR MICROELECTRONIC PACKAGING, filed Oct. 12, 2000, by Chia, et al.

BACKGROUND OF THE INVENTION

The present invention relates generally to microelectronic packaging. More specifically, but without limitation thereto, the present invention relates to insulating bonding wires to avoid package defects resulting from short circuits between adjacent bonding wires.

Bonding wires are used in microelectronic packaging to connect bond pads of a chip or die to package leads. The bonding wires are typically made of gold or aluminum and have a thin diameter of only about 30 microns.

As chip size becomes smaller as a result of improvements in manufacturing and chip density, and as the size of the microelectronic package increases, the bonding wires have to be made longer and spaced more closely together. The increased length and closer spacing increases the probability that adjacent bonding wires will deviate from their intended position and come into electrical contact with one another, resulting in a defective package.

Another problem with current techniques for attaching bonding wires is that wires may not cross each other to avoid coming into electrical contact with one another and have to be attached in an array, one after another, restricting the versatility of the microelectronic package.

SUMMARY OF THE INVENTION

The present invention advantageously addresses the needs above as well as other needs by providing a method and apparatus for insulating a bonding wire.

In one embodiment, the invention may be characterized as a method for insulating a bonding wire that includes the steps of attaching a bonding wire to a bond pad; coating the bonding wire with an insulating liquid while drawing the bonding wire through a bond tool from the bond pad to a package lead; and attaching the bonding wire to the package lead.

In another embodiment, the invention may be characterized as an apparatus for insulating a bonding wire that includes a dispensing tool coupled to a bond tool for forming a coating of an insulating liquid on a bonding wire after the bond tool attaches the bonding wire to a bond pad.

The features and advantages summarized above in addition to other aspects of the present invention will become more apparent from the description, presented in conjunction with the following drawings.

BRIEF DESCRIPTION OF THE DRAWINGS

The above and other aspects, features and advantages of the present invention will be more apparent from the following more specific description thereof, presented in conjunction with the following drawings wherein:

FIG. 1 is a magnified diagram illustrating a dispensing tool for insulating a bonding wire according to an embodiment of the present invention;

FIG. 2 is a magnified diagram illustrating the dispensing tool of FIG. 1 moved to a coating position for applying an insulating liquid to the bonding wire;

FIG. 3 is a magnified diagram illustrating the dispensing tool of FIG. 1 coating the bonding wire;

FIG. 4 is a magnified diagram illustrating the dispensing tool of FIG. 1 after coating the bonding wire; and FIG. 5 is a magnified diagram illustrating the attachment of the coated bonding wire of FIG. 4 to a package lead.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

FIG. 1 is a magnified diagram illustrating a dispensing tool for insulating a bonding wire. Shown are a dispensing tool 102, a bond tool 104, a bonding wire 106, a die 107, a bond pad 108, a nozzle orifice 110, an insulating liquid 112, a microelectronic package 113, and a package lead 114.

The die 107 is mounted on the microelectronic package 113 according to standard techniques well known in the art. The microelectronic package 113 has a plurality of package leads such as the package lead 114 that are connected by bonding wires to each bond pad 108. Current methods connect each bond pad 108 to each corresponding package lead 114 by an uninsulated bonding wire as explained above. In contrast to these methods, the following embodiments of the present invention connect each bond pad 108 to each corresponding package lead 114 by an insulated bonding wire.

Still referring to FIG. 1, the dispensing tool 102 has moved to a non-coating position away from the bond tool 104 to avoid mechanical interference while the bond tool 104 attaches the bonding wire 106 to the bond pad 108 according to standard techniques well known in the art.

The dispensing tool 102 includes the nozzle orifice 110 for dispensing the insulating liquid 112. Examples of the insulating liquid 112 are heat-cured epoxies and ultra-violet light-cured epoxies and polymers. The insulated liquid 112 may be pumped through the nozzle orifice 110 according to well known techniques for pumping liquids. In this example, the nozzle orifice 110 has a shape that is relatively narrow in the dimension parallel to the bonding wire 106 near the end of the bond tool 104 and relatively wide in the dimension perpendicular to the bonding wire 106. Typical dimensions for the nozzle orifice 110 are 100 microns in the dimension perpendicular to the bonding wire 106 and 50 microns in the dimension parallel to the bonding wire 106. The nozzle orifice 110 also has an arcuate shape that partially surrounds the bonding wire 106 in the coating position to apply a uniform thickness of the insulating liquid 112 to the bonding wire 106. Other shapes for the nozzle orifice 110 may be used to suit specific applications and materials used for the insulating liquid 112.

FIG. 2 is a magnified diagram illustrating the dispensing tool 102 moved to a coating position for applying the insulating liquid 112 to the bonding wire 106 after the bond tool 102 has begun drawing the bonding wire 106. In the coating position, the bonding wire 106 is partially surrounded by the nozzle orifice 110 of the dispensing tool 102 to apply a uniform thickness of the insulating liquid 112 to the bonding wire 106.

FIG. 3 is a magnified diagram illustrating the dispensing tool 102 coating the bonding wire 106. The insulating liquid 112 flows from the nozzle orifice 110 of the dispensing tool 102 around the bonding wire 106 as the bonding wire 106 is drawn through the bond tool 104 from the bond pad 108 toward the package lead 114. The dispensing tool 102 is coupled to the bond tool 104 so that the nozzle orifice 110 follows the end of the bonding wire 106 being drawn through the bond tool 104.

FIG. 4 is a magnified diagram illustrating the dispensing tool 102 after coating the bonding wire 106. When the bond tool 104 has drawn the bonding wire 106 from the bond pad 108 to the package lead 114, the flow of the insulating liquid 112 is stopped, and the dispenser tool 102 moves to the non-coating position to avoid mechanical interference with the bond tool 104.

FIG. 5 is a magnified diagram illustrating the attachment of the coated bonding wire 106 to the package lead 114. The bond tool 104 terminates and attaches the bonding wire 106 to the package lead 114 according to standard techniques well known in the art. An energy source 116 such as a heat gun or an ultraviolet light may be used to solidify the insulating liquid 112 coating the bonding wire 106. Alternatively, the insulating liquid 112 may be a self-curing material.

Additional bonding wires may be added and insulated in the same manner as the bonding wire 106 to complete the microelectronic package 113. Because each bonding wire 106 has been electrically insulated, bonding wires may cross over one another, have any desired length, and may be attached in any desired sequence without causing package defects. Insulating the bonding wires thus lowers the package cost, increases the pin density of the package, and improves the versatility of the package.

Other modifications, variations, and arrangements of the present invention may be made in accordance with the above teachings other than as specifically described to practice the invention within the spirit and scope defined by the following claims.

What is claimed is:

1. An apparatus for insulating a bonding wire comprising:
    a bond tool for attaching a bonding wire to a bond pad;
    a dispensing tool coupled to the bond tool wherein the dispensing tool has a nozzle orifice having an arcuate shape in a dimension perpendicular to the bonding wire for partially surrounding the bonding wire to form a coating of an insulating liquid on the bonding wire after attaching the bonding wire while the bonding wire is drawn through the bond tool.

2. The apparatus of claim 1 wherein the dispensing tool moves between a non-coating position for avoiding mechanical interference with the bond tool and a coating position for coating the bonding wire with the insulating liquid.

3. The apparatus of claim 1 wherein the nozzle orifice is relatively narrow in a dimension parallel to the bonding wire and relatively wide in a dimension perpendicular to the bonding wire.

4. The apparatus of claim 1 further comprising an energy source coupled to the dispensing tool for solidifying the insulating liquid coating the bonding wire.

5. The apparatus of claim 4 wherein the energy source is one of a heat source and an ultraviolet light source.

* * * * *